United States Patent [19]

Pines et al.

[11] Patent Number: 4,899,111
[45] Date of Patent: Feb. 6, 1990

[54] PROBE FOR HIGH RESOLUTION NMR WITH SAMPLE REORIENTATION

[75] Inventors: Alexander Pines, Berkeley, Calif.; Ago Samoson, Tallinn, U.S.S.R.

[73] Assignee: The Regents of the University of California, Oakland, Calif.

[21] Appl. No.: 227,729

[22] Filed: Aug. 3, 1988

[51] Int. Cl.⁴ .......................................... G01R 33/20
[52] U.S. Cl. .................................................. 324/321
[58] Field of Search ............... 324/300, 307, 308, 318, 324/321, 311

[56] References Cited

U.S. PATENT DOCUMENTS

| | | | |
|---|---|---|---|
| 4,301,410 | 11/1981 | Wind et al. | 324/321 |
| 4,352,066 | 9/1982 | Kendrick et al. | 324/321 |
| 4,511,841 | 4/1985 | Bartuska et al. | 324/321 |

OTHER PUBLICATIONS

Azevedo, L. J., "Rotating Sample Holder Without Mechanical Linkages", Rev. Sci. Instrum, 50(2), Feb. 1979.

Primary Examiner—Hezron E. Williams
Assistant Examiner—Kevin D. O'Shea
Attorney, Agent, or Firm—McCubbrey, Bartels, Meyer & Ward

[57] ABSTRACT

An improved NMR probe and method are described which substantially improve the resolution of NMR measurements made on powdered or amorphous or otherwise orientationally disordered samples. The apparatus mechanically varies the orientation of the sample such that the time average of two or more sets of spherical harmonic functions are zero.

16 Claims, 7 Drawing Sheets

PROBE FOR HIGH RESOLUTION NMR WITH SAMPLE REORIENTATION

This invention was made in the course of, or under, contract DE-AC-03-765SF00098 between the United States Department of Energy and the University of California for the operation of the Lawrence Berkeley Laboratory.

BACKGROUND OF THE INVENTION

The present invention relates to the measurement of nuclear magnetic resonance (NMR) and, in particular, to the NMR measurement of polycrystalline and/or amorphous solids.

Since its discovery in 1946, Nuclear Magnetic Resonance (NMR) has become a powerful analytical tool in studies of various liquid and solid materials. It is non-invasive and gives results which can be readily interpreted. The measured chemical shifts can be immediately associated with model structural units of the substance under study. In addition, relaxation rates provide information about molecular motions. Characteristic resonance frequencies of magnetic nuclei lie in a convenient radio-frequency (RF) range and can be detected with well-known electronic techniques An NMR experiment may be described as follows. Nuclei may be regarded as bar magnets that, because of their charge and nuclear spin, have associated magnetic moments. These magnetic moments are randomly oriented in the absence of external forces. When placed in an external magnetic field, these nuclei have discrete spin states. A quantized amount of energy is associated with each such spin state. The energy of each such state depends on the nuclear magnetic moment of the nuclei being studied and magnetic field in the vicinity of the nucleus in question. This magnetic field is the superposition of the external magnetic field and the magnetic fields generated by nearby electrons and nuclei. Hence, measurements of the energy levels associated with each of the spin states can provide information about the environment of the nuclei being studied.

An NMR measurement is made by determining the energy difference between nuclear spin states. In order to accomplish this, a sample of the material in question is placed in an external magnetic field and excited by applying a second, oscillating magnetic field in a direction perpendicular to the first steady field. This is accomplished by applying oscillating RF energy across a coil positioned perpendicular to the direction of the external magnetic field. A second magnetic field is created by a pulsing current in this coil. This second field causes transitions between nuclear spin states whose energies are determined by the first field. The energy absorbed by the nuclei during such an excitation or emitted thereby after such an excitation provides information on the differences in energy between the various spin states.

The accuracy of NMR measurements depends upon the physical form of the sample being studied. Highly accurate chemical shift determinations and separation of NMR lines are possible for liquid samples due to the random tumbling and rapid reorientation of sample molecules in solution. This rapid reorientation effectively causes the surroundings of the resonating nuclei to appear isotropic on the time scale of the NMR experiment.

If polycrystalline, powdery, glassy solids, or the like are studied, however, observable lines are broadened due to different orientations of particles with respect to the static magnetic field. Anisotropic line broadening has traditionally rendered high-resolution work impossible with this type of sample.

Various methods have been employed in order to reduce the amount of line-broadening observed for solid samples. For example, techniques in which crystalline materials are oriented in a particular direction with respect to the external magnetic field are known to the prior art. Unfortunately, such methods are impractical in many cases, since many solids cannot be obtained in single crystalline form nor oriented in a uniform direction throughout the material. In fact, many samples for which NMR spectra are desired exist only as powders or amorphous solids.

In the prior art, line broadening difficulties can be partially overcome by using magic angle spinning (MAS). Using this technique, the sample is rotated rapidly at an angle of 54.7 degrees with respect to the external magnetic field, i.e., the magic angle. For reasons that will be discussed in more detail below, this spinning removes so-called first order line broadening caused by such factors as chemical shift anisotropy, secular dipolar interactions, and first order quadrupole interactions. As a result, line widths on the order of 100 Hz are typically observed for non-quadrupole nuclei.

Although these line widths are a significant improvement over those obtained without MAS, they are still far broader than those obtained with liquid samples. Typically, line widths of 0.2 Hz are observed for liquids.

In the case of quadrupole nuclei, the line broadening is even worse. Line widths of quadrupole nuclei are determined primarily by second order quadrupole interactions, and are on the order of several kHz or more for light nuclei in strong magnetic fields. Magic angle spinning does not completely correct for this line broadening.

Accordingly, it is an object of the present invention to provide an improved apparatus for measuring nuclear magnetic properties of solids.

It is a further object of the present invention to provide an NMR apparatus with improved resolution for structural determinations of powdered or amorphous or otherwise orientationally disordered solid samples.

These and other objects of the present invention will become apparent to those skilled in the art from the following detailed description of the invention and the accompanying drawings.

SUMMARY OF THE INVENTION

Figure 1:
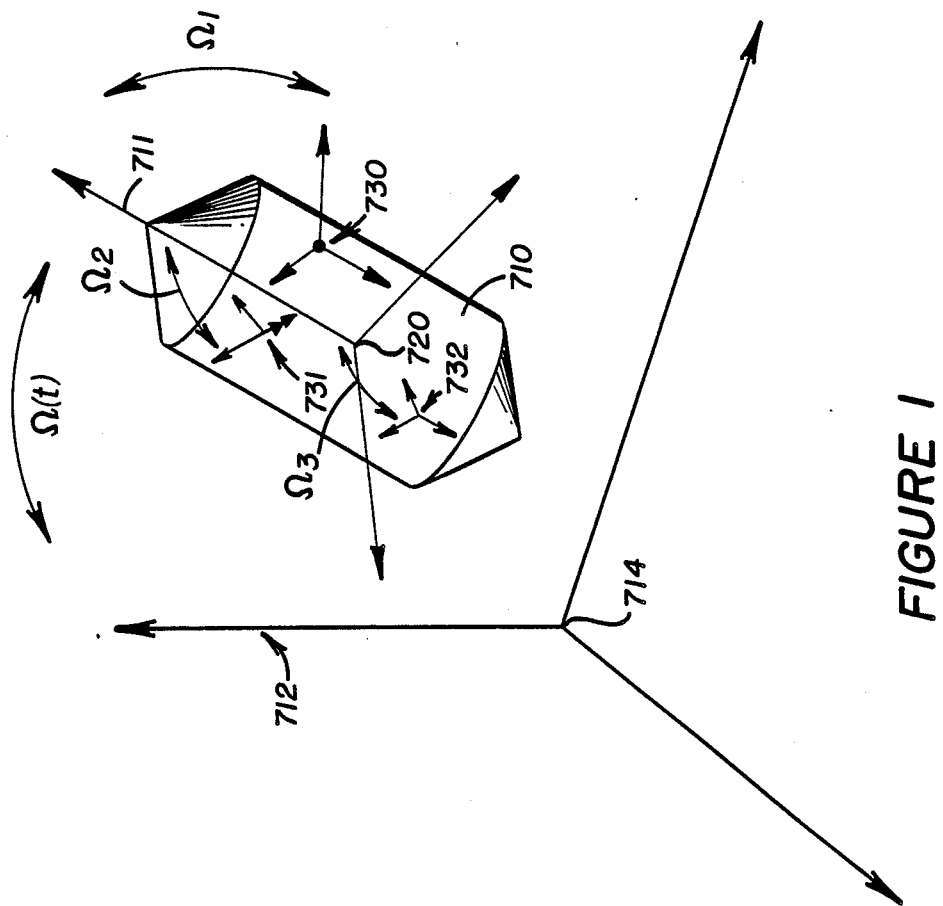
FIG. 1 illustrates the orientation of particles in a sample holder in a magnetic field.

The present invention comprises an apparatus for measuring the NMR spectra of a sample. The sample is placed in a sample holder in a magnetic field. The sample holder is then moved over a trajectory for which the average values of two or more sets of spherical harmonic functions is substantially zero.

In one embodiment of the invention, this is accomplished by spinning said sample about a sample axis. The sample axis is then pivoted about a fixed end or point thereof between the first and second angles with respect to the direction of said magnetic field.

In a second embodiment of the invention, the sample is spun about the sample axis. The sample axis is then caused to sweep out a cone having an opening angle of $\Theta_2$. The cone is inclined at an angle $\Theta_1$ with respect to the magnetic field. Here, $\Theta_1$ and $\Theta_2$ are chosen such that the cosine of each angle is a zero of a Legendre polynomial.

DETAILED DESCRIPTION OF THE INVENTION

Under rapid isotropic reorientation, anisotropic nuclear interactions are averaged away. Rotation and diffusion motions in liquids and collisions in gases are examples of naturally occurring molecular motions which provide such averaging. Nuclear spins in solids or partially oriented samples, in contrast, are locked in constraining or partially constraining environments and do not enjoy the benefit of rapid isotropic orientational randomination. The NMR spectra of powdered solids thus exhibit broad, and frequently featureless, lines reflecting the effects of the anisotropies of the spin interactions.

Consider an orientationally disordered sample which is comprised of particles or regions (sets of particles) which are small crystals, fragments thereof, or molecules. In the NMR experiment, the sample is placed in a magnetic field having a predetermined direction. The frequencies of electromagnetic energy absorbed or emitted by each particle will depend on its orientation relative to the magnetic field. Since the sample contains a continuous range of particle orientations, a broad spectrum is observed. The broadness of this spectrum limits the usefulness of such measurements.

Ideally, one would like to measure similar properties with solid samples as are measured in liquid samples, namely, the NMR frequencies of each particle or region averaged over all possible orientations of that particle or region. Such an average is independent of the particle size and constitutes a sensitive measure of the underlying physical properties of the material being measured.

In principle, one can accomplish this by melting or dissolving the sample and measuring the sample in the liquid state. However, many samples of interest can not be studied in this manner.

A second prior art technique, referred to as magic angle spinning, provides a partial averaging motion analogous to the natural motions that provide averaging in liquids and gases. The apparent first order anisotropy of the nuclei in a rapidly spinning disordered sample depends on the angle between the direction of the external magnetic field and the axis about which the sample is spun. By choosing the proper angle, improvements in the observed line widths are observed.

The manner in which the magic angle is chosen may be most easily understood with reference to FIG. 1. A sample is placed in a rotor 710 which is located in a magnetic field having the direction shown at 712. The magnetic field defines a first coordinate system having axes shown at 714. The sample rotor may be described with reference to a second coordinate system shown at 720. At any given time, the angular relationship of this coordinate system with respect to first coordinate system 714 may be specified by giving the values of a set of angles $\Omega(t)$. As rotor 710 moves, $\Omega(t)$ changes.

Within the rotor, each particle or region of the sample has its own orientation which may be specified by a coordinate system associated with that particle or region. Exemplary particle coordinate systems are shown at 730-732. Each of the particle coordinate systems may be specified with respect to coordinate system 720 by giving the values of a set of angles $\Omega$. Particle coordinate system 730 is specified by $\Omega_1$; particle coordinate system 731 is specified by $\Omega_2$, and particle coordinate system 732 is specified by $\Omega_3$. It should be noted that $\Omega_1$, $\Omega_2$, and $\Omega_3$ are constants whose values are fixed once the sample is placed in rotor 710.

Each set of angles, $\Omega$, consists of three angles, $\alpha$, $\Theta$ and $\phi$, which specify the angles between the two relevant coordinate systems.

It may be shown that, to a good approximation, the NMR frequencies emitted by the ith particle or region due to secular interactions up to rank L in the sample are given by $$w(\Omega_i,\Omega(t)) = w_0 + \sum_{l=1}^{L} \sum_{m=-l}^{l} A_{lm}(\Omega_i)Y_{lm}(\Omega(t)) \quad (1)$$

Here, the values of $A_{lm}$ depend on $\Omega_i$ and the chemical properties of the sample. The functions $Y_{lm}$ are the generalized spherical harmonic functions of rank l. For each rank l, there is a set of 2l+1 such functions. That is, m takes on the values from $-1$ to $+1$.

For the purposes of this discussion, $$D_i = \sum_{l=1}^{L} \sum_{m=-l}^{l} A_{lm}(\Omega_i)Y_{lm}(\Omega(t)) \quad (2)$$

will be referred to as the frequency dispersion due to secular interactions contributed by the ith particle or region in the sample. The measured NMR signal is the sum of the signals emitted by each of the particles. Each particle contributes a constant set of frequencies $w_0$ to the spectrum and a frequency dispersion, $D_i$ which is different for each particle, since each particle has a different orientation.

The frequencies $w_0$ depend only on the chemical properties of the sample. Ideally, it is these frequencies that one would like to measure. However, these frequencies are masked by frequency dispersion terms which are different for different particles or regions. These terms give rise to the broad, often featureless, spectra observed for orientationally disordered samples.

When rotor 710 is spun sufficiently fast about its axis 711, the measured spectrum for the ith particle is the average of the spectrum given in Eq. (1), the average being taken over the range of $\Omega(t)$ angles realized by the spinning motion. Hence, the contribution of the ith particle becomes $$<w(\Omega_i,\Omega(t))> = w_0 + \sum_{l=1}^{L}\sum_{m=-l}^{l} A_{lm}(\Omega_i)<Y_{lm}(\Omega(t))> \quad (3)$$

Here, $<\ >$ denotes the average value of the quantity enclosed by the brackets. When rotor 710 is spun about axis 711, the average value of the generalized spherical harmonics, $<Y_{lm}(\Omega(t))>$, is zero for all m values other than 0. For m=0, $$<Y_{l0}(\Omega(t))> = P_l(\cos\Theta) \quad (4)$$

where $P_l$ denotes the Legendre polynomial of order l and $\Theta$ is the angle between the direction of the magnetic field, i.e., direction 712, and rotor axis 711.

Hence, when rotor 710 is spun about axis 711, the frequency dispersion contributed by each particle is given by $$D_i = \sum_{l=1}^{L} B_l P_l(\cos\Theta) \quad (5)$$

Here, the $B_l$ are constants that depend on the properties of the sample.

In the case of magic angle spinning, $\Theta$ is chosen such that $P_2(\cos\Theta)$ is zero, i.e., $\Theta=54.7$ degrees. Spinning a sample at the magic angle described above thus removes so-called first order line broadening. First order line broadening effects are proportional to the $P_2$ term, and correspond primarily to chemical shift anisotropy, secular dipolar interactions and first order quadrupole interactions.

The approach just described leads to a significant reduction in observed line widths only when the $P_2$ term in Eq. (5) is the major contributor to the frequency dispersion. This is the case for NMR measurements based, for example, on $C^{13}$, $Si^{29}$, and $P^{31}$.

Unfortunately, many cases of interest do not satisfy this constraint. For example, both the $P_2$ and $P_4$ terms are significant for $B^{11}$, $O^{17}$, $Na^{23}$, and $Al^{27}$. These cases correspond primarily to second order quadrupole broadening. Broadening due to second order dipole-dipole interactions and susceptibility anisotropy can also contribute to the observed frequency dispersion in magic angle spinning of the spin one half nuclei, e.g., $C^{13}$ mentioned above. When such physical effects are present, more than one of the Legendre polynomials are important. Although spinning the sample at the magic angle provides some improvement in these cases, the resultant spectra are still too broad to provide all the data sought in NMR measurements based thereon.

A method for improving the poor resolution of NMR spectra for orientationally disordered systems, which has been suggested in the prior art, is to increase the magnetic field strength. It can be shown that the resolution of an NMR measurement which is limited by second order broadening increases as the magnetic field is increased. Unfortunately, unrealistically high magnetic fields are often required to remove the line broadening observed with powders.

When two or more terms in the Legendre expansion are significant, some additional improvement can be obtained by adjusting the spin angle empirically to minimize the observed frequency dispersion. However, if more than one term in the Legendre expansion is important, the frequency dispersion is often still too large to provide useful data.

The present invention provides a major reduction in frequency dispersion even when two or more of the terms in Eq. (5) are significant. The present invention utilizes a more complex pattern of motion so as to enable a more averaged measurement of the frequency of electromagnetic energy absorbed or emitted by each particle in an orientationally disordered sample. Magic angle spinning only averages the frequencies over a limited range of sample orientations. Hence, it does not provide the same resolution as obtained in liquids where the averaging is performed over all possible orientations of each particle or region of the sample with respect to the direction of the magnetic field. The manner in which this is accomplished will first be described with respect to the preferred embodiment of the present invention. Other methods for implementing the improved averaging scheme of the present invention will then be described.

Figure 2:
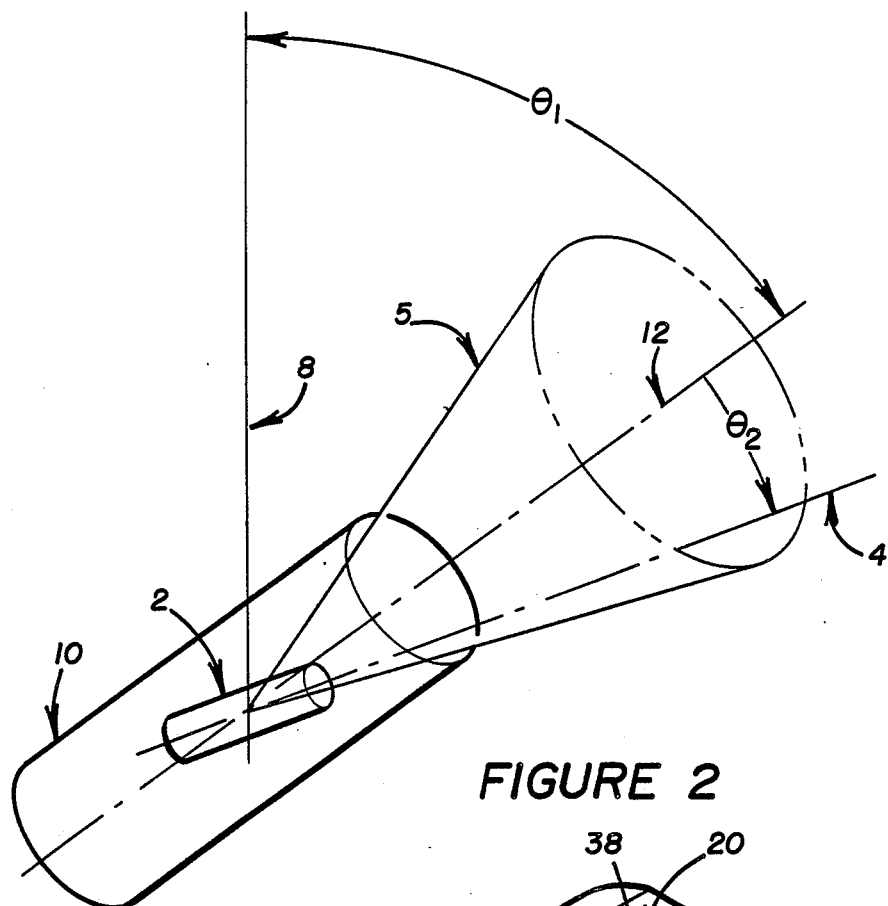
FIG. 2 is a schematic representation of the relative angles at which a spinning sample is oriented in an NMR instrument when positioned according to the principles of the present invention.

In the preferred embodiment of the present invention, these second order effects are overcome by rapidly spinning the sample about two axes. The basic spinning motion implemented in the preferred embodiment of the present invention is illustrated in FIG. 2. A sample is placed in a sample holder 2 that spins about an axis 4 at an angular velocity of $w_1$. Sample holder 2 is then placed within a larger cylinder 10 that spins about a second axis 12 which spins at angular velocity of $w_2$. This larger cylinder 10 is inclined at an angle $\Theta_1$ with respect to the external magnetic field direction which is shown at 8. As a result of this motion, the axis 4 of sample holder 2 sweeps out a cone 5 having an opening angle of $\Theta_2$.

It may be shown that the resultant center band frequency dispersion due to secular interactions up to rank L observed when the sample is simultaneously spun about $\Theta_1$ and $\Theta_2$ is a function of products of Legendre polynomials:

$$D = \sum_{l=1}^{L} C_l P_l(\cos\Theta_1) P_l(\cos\Theta_2) \quad (6)$$

Here, the $C_l$ are constants which depend on the chemical and physical properties of the sample.

For quadrupole and dipole-dipole broadening, it may be shown that only the terms for which l is an even number are significantly different from zero. Furthermore, the terms for which l is equal to two or four are the major contributors to the frequency dispersion in this case. Hence, in the preferred embodiment of the present invention, the angles are chosen such that $$P_2(\cos\Theta_1) = P_4(\cos\Theta_2) = 0 \quad (7)$$

Alternatively, $\Theta_1$ and $\Theta_2$ could be chosen such that $$P_2(\cos\Theta_2) = P_4(\cos\Theta_1) = 0 \quad (8)$$

Other frequency dispersion effects may be reduced by choosing $\Theta_1$ and $\Theta_2$ such that the Legendre polynomial terms which most contribute to these effects are zero.

The angular velocities, $w_1$ and $w_2$, must be sufficiently large to assure that a period of the rotational motion is small compared to the NMR relaxation times for the sample being measured. In addition, for reasons to be discussed below, certain integer ratios of $w_1$ and $w_2$ are preferably to be avoided.

Figure 3:
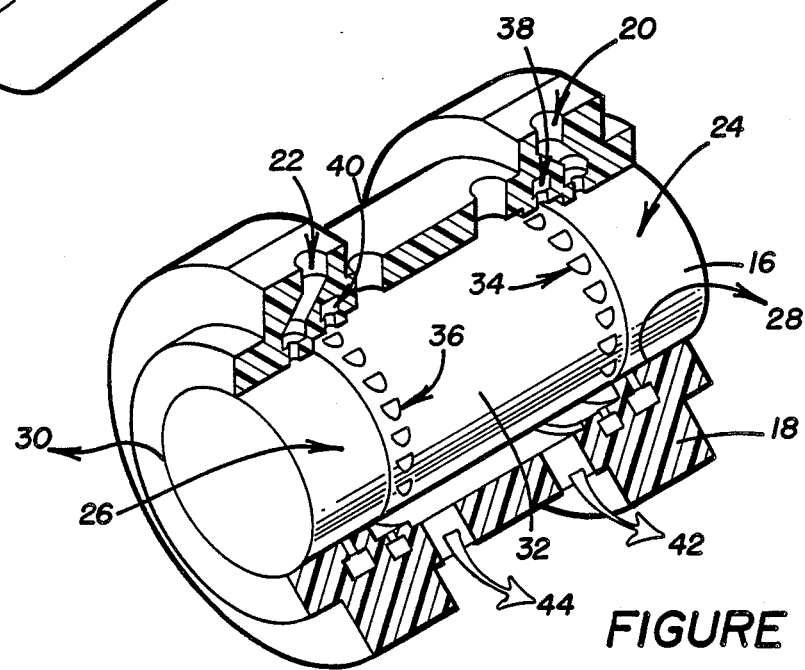
FIG. 3 is a partial cut-away view of a spinner utilized in an apparatus according to the present invention.

In order to achieve these high spin rates, the present invention employs cylindrical objects that are suspended on air bearings and driven by air jets. FIG. 3 illustrates the basic air bearing configuration. A cylinder 16 is held in an outer housing 18. The outer housing 18 has inlets 20 and 22 that enable pressurized air to enter, thereby suspending and "lubricating" cylinder 16 on air bearing surfaces 24 and 26 within the outer housing 18. Air exits from air bearings 24 and 26 via exit spaces between the outer housing 18 and the cylinder 16 which are shown at 28 and 30.

The central surface 32 of cylinder 16 is of a slightly different diameter than the outer surface. Impeller grooves 34 and 36 are cut into central surface 32. Cylinder 16 is made to rotate by applying pressurized air against the impeller grooves 34 and 36. The air that impinges upon impeller grooves 34 and 36 to drive cylinder 16 enters at orifices 38 and 40. The spent impeller drive air then exits the outer housing 18 through the orifices at 42 and 44.

Figure 4:
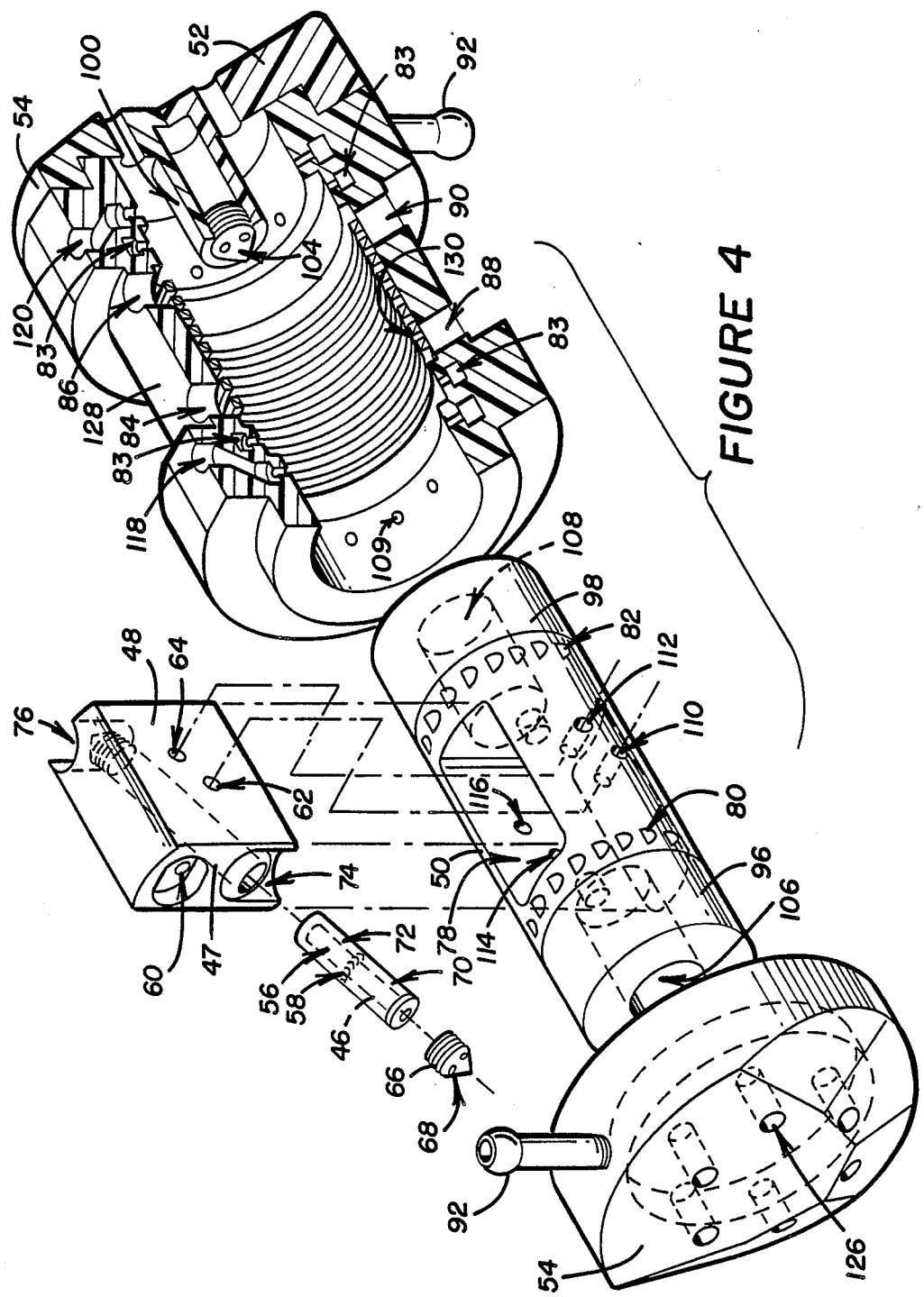
FIG. 4 is an exploded view of an apparatus according to the present invention for causing a sample to spin in the pattern shown in FIG. 2.

A combination of two simultaneously spinning systems is necessary to achieve the dual motion described in FIG. 2. An apparatus for accomplishing this dual motion is shown in FIG. 4. Essentially, the apparatus depicted in FIG. 4 consists of five basic parts. The five parts are a sample holder 46, a first housing 48 that holds holder 46, a central cylinder 50 which in turn contains first housing 48, an apparatus housing 52, and end caps 54 (only one of which is depicted).

A sample of the material to be studied is placed into the center bore 56 of sample holder 46. Sample holder 46 includes a ring of notched impeller grooves 58 cut into the surface thereof. A stream of pressurized drive air impinging onto impeller grooves 58 causes sample holder 46 to spin in the manner described with reference to cylinder 16 shown in FIG. 3. In a typical embodiment, sample holder 46 spins at 2000 hz.

Sample holder 46 is inserted into chamber 47 in housing 48. Sample holder 46 is held in place by end caps 66 at each end of chamber 47. One of these end caps is hidden and hence not visible in the drawing.

Sample holder 46 is supported on air bearings which are implemented by suspending air bearing surfaces 70 and 72 with respect to two corresponding surfaces in chamber 47 of housing 48. The suspension mechanism is essentially that described with reference to FIG. 3 above. Air is injected into the space between housing 48 and air bearing surfaces 70 and 72 through orifices in housing 48. The orifices are adjacent to said air bearing surfaces. The spent air from the air bearings exits housing 48 through orifices 68 in end caps 66.

The air utilized by the air bearings and drive mechanism enters the first housing 48 through two air entrance orifices 60, one on each end of first housing 48. One of the air entrance orifices 60 is not shown because it is hidden in the view shown in FIG. 4. Housing 48 includes channels analogous to those shown in FIG. 3 for routing the air from the entrance orifices 60 to the air bearing surfaces 70 and 72. Similarly, a channel in housing 48 routes the air to a location over impellers 58.

The spent spin air from the impellers 58 is vented from the first housing 48 at the spin air exit orifices 62 and 64.

As noted above, sample holder 46 is inserted into the first housing 48 and held in place by two end caps 66 which include orifices 68. The spent air from air bearing surfaces 70 and 72 is exhausted primarily through the orifices 68 into concave grooves 74 and 76. Some of the air from air bearing surfaces 70 and 72 exits through air exit orifices 62 and 64.

First housing 48 fits into the central cavity 78 of central cylinder 50. First housing 48 is shaped such that when inserted in central cylinder 50, the outer surface of first housing 48 is congruent with the cylindrical surface of cylinder 50. Air exit orifices 62 and 64 are aligned with air exit orifices 110 and 112 in central cylinder 50 such that when first housing 48 is inserted in central cylinder 50, air exiting first housing 48 through air exit orifices 62 and 64 is routed to the surface of central cylinder 50 through air exit orifices 110 and 112.

Air exiting first housing 48 through orifices 68 in end caps 66 is also routed to the surface of central cylinder 50 through concave groves 74 and 76 which form a passage between first holder 48 and the end walls of cavity 78. The passage allows air to leaving end caps 66 to reach the surface of central cylinder 50.

Pressurized air for the air bearings and drive mechanism in first housing 48 is supplied through the ends of central cylinder 50 via passages 106 and 108. As will be explained in more detail below, this air is injected into said passages 106 and 108 through protrusions 100 in end caps 54.

Central cylinder 50 has many features in common with first housing 48. Central cylinder 50 has two rings of notched impeller grooves 80 and 82 cut into the surface. Pressurized air applied against impeller grooves 80 and 82 causes central cylinder 50 to spin. Inlets for the pressurized impeller air are located at positions 118 and 120. Outlets for exiting impeller air 84, 86, 88 and 90 are found in device housing 52.

Central cylinder 50 is held within device housing 52 by two end caps 54. Each end cap 54 has an air inlet port 92 which is connected to a source of compressed air. Air inlet ports 92 are connected to hollow protrusions 100 which mate with passages 106 and 108 in central cylinder 50. The end 104 of each protrusion 100 includes orifices for allowing compressed air to flow into passage 106 which in turn provides air to air entrance orifices 60 in first housing 48.

Central cylinder 50 is supported in device housing 52 on air bearings in a manner analogous to that described with reference to FIG. 3. Central cylinder 50 includes air bearing surfaces 96 and 98 on the outer ends thereof. Air is injected into the space between air bearing surfaces 96 and 98 and the walls of device housing 52 through orifices 109 in the wall of device housing 52. The air used for this purpose is coupled to orifices 109 through channels in device housing 52. Two such channels are shown at 118 and 120. The channels in question are connected to a source of compressed air through an external manifold which will be explained in more detail with reference to FIG. 5. Similarly, compressed air is directed against impellers 80 and 82 by connecting orifices 83 to a source of compressed air through a second manifold which will be discussed in detail with reference to FIG. 5.

As mentioned above, spin air exits 62 and 64 of first housing 48 are directly aligned with exit orifices 110, 112, 114 (partially obscured) and 116 in central cylinder 50. Exit orifices 114 and 116 service a second set of spin air exits in first housing 48 which are obscured from view in FIG. 4. Spent spinner air from holder 46 thus exits from spin air exits 62 and 64, and then through air exit orifices 110, 112, 114 and 116. This spinner air ultimately discharges from the apparatus through air outlets 84, 86, 88 and 90. Spent air emitted from first housing 48 via concave surfaces 74 and 76 also leaves the apparatus via air outlets 84, 86, 88 and 90. Spent air from the air bearings for central cylinder 50 exits through air ports 126 which are located in end caps 54.

The central portion 128 of device housing 52 is enlarged to accommodate detector coil 130. Detector coil 130 is used to detect RF frequencies during NMR measurements.

Figure 5:
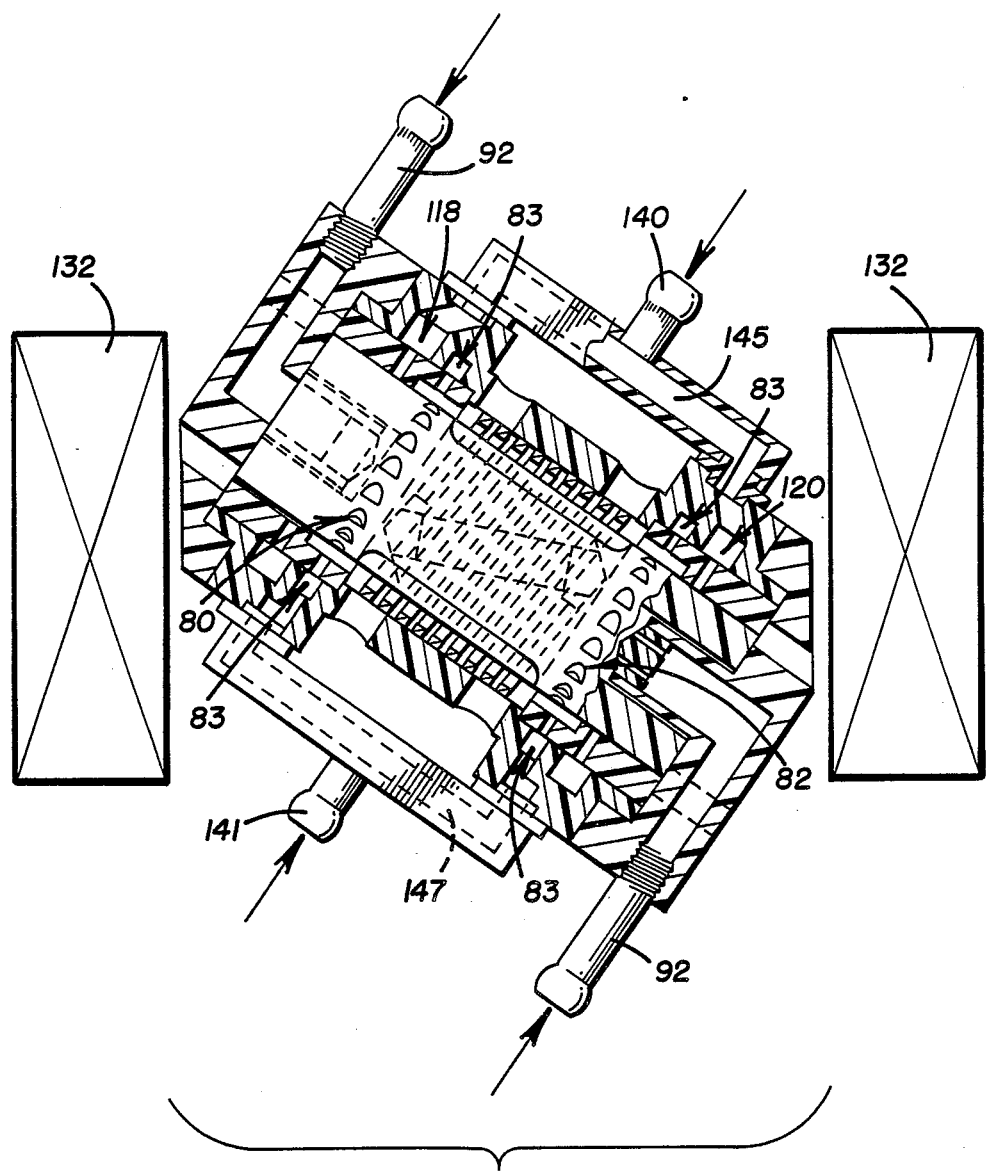
FIG. 5 is a cross sectional view of the apparatus shown in FIG. 4 positioned between the poles of a magnet.

FIG. 5 shows a cross section of the apparatus of the present invention positioned between the poles 132 of an external magnet. Compressed air is supplied through inlet ports 92 shown in FIG. 5 and through two additional ports 140 and 141 which are connected to manifolds 145 and 147, respectively. Manifold 147 supplies air to inlets 83 which direct the air in question against impellers. Manifold 145 is connected to inlets 118 and 120 which supply air to suspend central cylinder 50 on its air bearing surfaces 96 and 98 as shown in FIG. 4.

Referring again to FIG. 4, central cylinder 50 spins at angular velocities $w_2$ which are several hundreds of revolutions per second. Hence, the forces applied to sample holder 46 can be quite large. These forces must be supported by the air bearings which support sample holder 46 in first housing 48.

These forces may be reduced by properly choosing the dimensions of sample holder 46. Sample holder 46 spins at speeds in excess of two thousand revolutions per second. Sample holder 46 is, in effect, a small gyroscope with its axis displaced from the vertical by angle $\Theta_2$ shown in FIG. 2. As is known in the mechanical arts, a gyroscope so displaced will precess such that its axis sweeps out a cone at an angular velocity which depends on the moments of inertia of the gyroscope, $\Theta_2$, and $w_1$. It may be shown that the gyroscope will precess with an angular velocity $w_{nut}$ satisfying the following relationship:

$$w_1 = (I_{tr} - I_{ax})w_{nut}\cos(\Theta_2)/I_{ax}, \quad (9)$$

where $I_{tr}$ and $I_{ax}$ are transverse and axial moments of inertia of sample holder 46.

If the moments of inertia are chosen such that the desired value for $w_2$ is equal to the value of $w_{nut}$ given in Eq. (9), then sample holder 46 will precess at the desired $w_2$ value without any forces being applied through first housing 48. The moments of inertia in question depend on the radius and length of sample holder 46 which comprises a hollow cylinder. Hence, by choosing the proper radius and sample compartment size for any given length sample holder, the forces in question may be substantially reduced. The use of such gyroscopic precession will be discussed further with reference to an alternate embodiment of the present invention described below.

Figure 6:
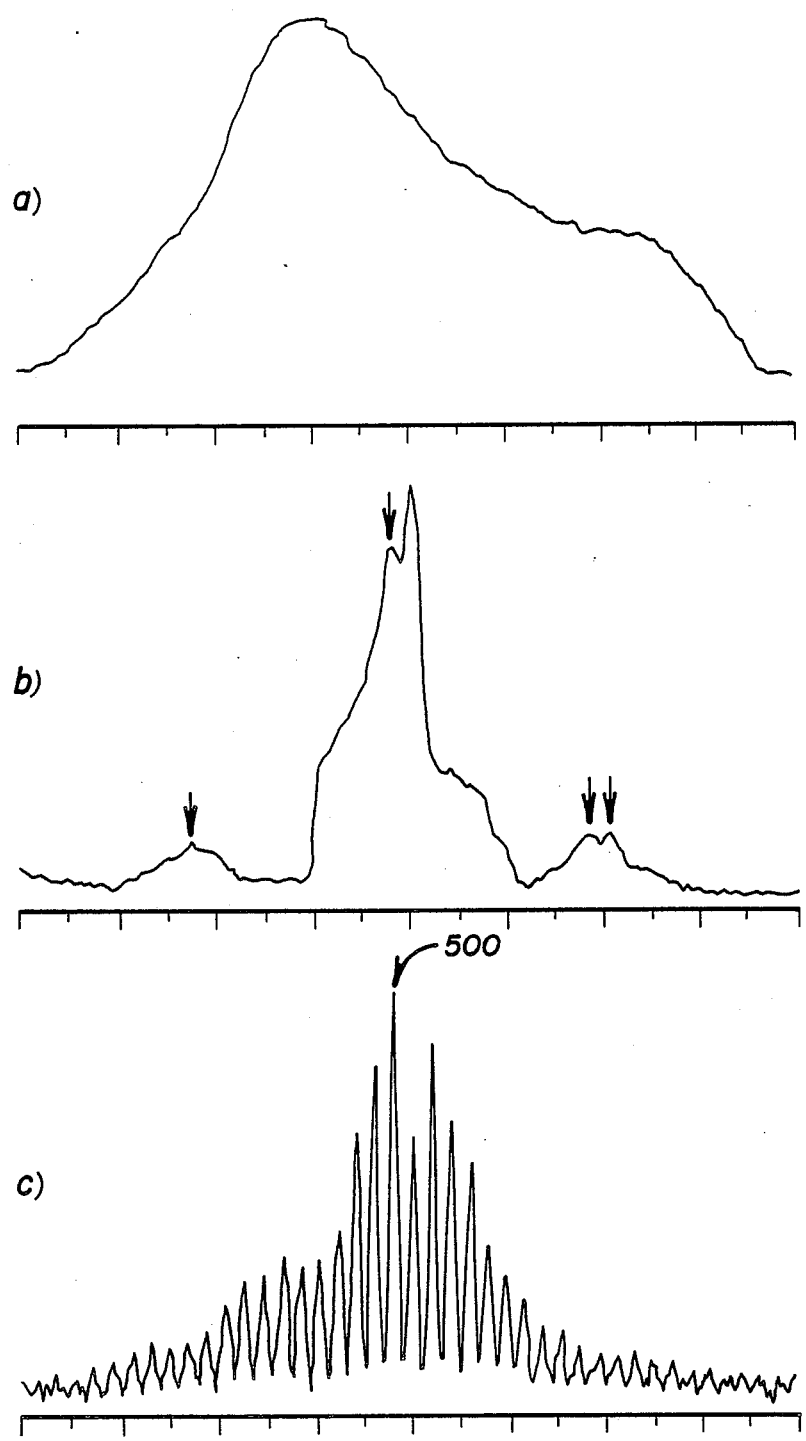
FIG. 6(a) is an NMR spectrum of Na$^{23}$ in a powdered sample of sodium oxalate obtained without sample spinning.
FIG. 6(b) is an NMR spectrum of Na$^{23}$ in a powdered sample of sodium oxalate obtained with spinning at the magic angle.
FIG. 6(c) is an NMR spectrum of Na$^{23}$ in a powdered sample of sodium oxalate obtained by using the apparatus shown in FIG. 4.

The dramatic improvement obtained with the present invention is illustrated in FIGS. 6(a)–6(c) which show Na$^{23}$ NMR spectra for a powdered sodium oxalate sample taken with various apparatuses. FIG. 6(a) is a spectrum obtained with the sample stationary. As can be seen from the figure, the resultant spectrum is quite broad and shows few features of interest.

FIG. 6(b) is an NMR spectrum of the same sodium oxalate sample, but with the sample being spun at the magic angle. The peaks marked by the arrows in FIG. 6(b) are side bands resulting from the modulation of the NMR signal by the rotation of the sample. Although the spectrum shown in FIG. 6(b) displays a considerably narrower line for Na$^{23}$, the line width is still far from satisfactory.

FIG. 6(c) is an NMR spectrum from the same sodium oxalate sample using the embodiment of the present invention as shown in FIG. 4. The sample holder 46 shown in FIG. 4 was spun at 2000 hz while central cylinder 50 was spun at 400 hz. The values for $\Theta_1$ and $\Theta_2$ in Eq. (6) were chosen to be 54.7 degrees and 70.1 degrees which correspond to zeros of $P_2(\cos\Theta)$ and $P_4(\cos\Theta)$. The Na$^{23}$ line is shown at 500. The remaining peaks are side bands resulting from the modulation of the signal from the Na$^{23}$ line. These side bands can be eliminated, for example, by spinning the sample at higher angular velocities or by side band suppression techniques analogous to those used in magic angle spinning. As can be immediately appreciated from these figures, the line width obtained with the present invention is dramatically smaller than that obtained using either of the two above mentioned prior art techniques.

The values of $\Theta_1$ and $\Theta_2$ in the above described embodiment of the present invention were chosen to eliminate effects arising from the $P_2$ and $P_4$ terms of Eq.(6). In the case of Na$^{23}$, these terms are the two main contributors to the line width. The line widths obtained with other nuclei may be the result of terms other than $P_2$ and $P_4$. It will be apparent from the above discussion that by choosing $\Theta_1$ and $\Theta_2$ such that $P_i(\cos\Theta_1)=0$ and $P_j(\cos\Theta_2)=0$, line broadening which results from any two terms depending on $P_i$ or $P_j$ in Eq.(6) can be eliminated by the above described embodiment of the present invention.

An apparatus according to the present invention can also be utilized for eliminating line broadening arising from three or more terms in Eq.(6). In the apparatus shown in FIG. 4, the sample holder consists of a cylinder which spins about its axis. This cylinder is mounted in a second cylinder (central cylinder 50) such that the sample holder axis is inclined at $\Theta_1$ with respect to axis of the second cylinder. The second cylinder then rotates at about its axis which is inclined at $\Theta_2$ with respect to the magnetic field direction.

This type of structure can be utilized for more complex motions. For example, an apparatus for eliminating three terms from Eq. (6) can be constructed by mounting central cylinder 50 shown in FIG. 4 inside an outer cylinder such that the axis of central cylinder 50 is inclined at angle $\Theta_2$ with respect to the axis of the outer cylinder. The outer cylinder would then be spun at a third angular velocity about its axis which would be inclined at an angle $\Theta_3$ relative to the magnetic field direction. It may be shown that the frequency dispersion obtained in such an arrangement is a function of products of three Legendre polynomials:

$$D = \sum_{i=1}^{L} E_i P_i(\cos\Theta_i) P_i(\cos\Theta_2) P_i(\cos\Theta_3) \quad (10)$$

One is free to chose the values of $\Theta_1$, $\Theta_2$, and $\Theta_3$. Hence, if $\Theta_1$, $\Theta_2$, and $\Theta_3$ are chosen such that:

$$P_l(\cos\Theta_1) = P_m(\cos\Theta_2) = P_n(\cos\Theta_3) = 0 \quad (11)$$

then the contributions to the line width of the terms depending on $P_l$, $P_m$, and $P_n$ can be eliminated.

It is apparent from the above discussion that, in principle, N terms can be eliminated by constructing a multiple spinning apparatus having N spinning nested cylinders, the sample being contained in the innermost cylinder. If the sample holding cylinder is labeled as 1, then the ith cylinder is mounted in the (i+1)st cylinder such that the axis of the ith cylinder is inclined at an angle $\Theta_i$ with respect to the axis of the (i+1)st cylinder for i=1 to (N−1). The axis of the Nth cylinder is inclined at an angle $\Theta_N$ with respect to the magnetic field direction. The angles $\Theta_i$ are chosen such that the cosine of each angle is a zero of a different Legendre polynomial.

Figure 7:
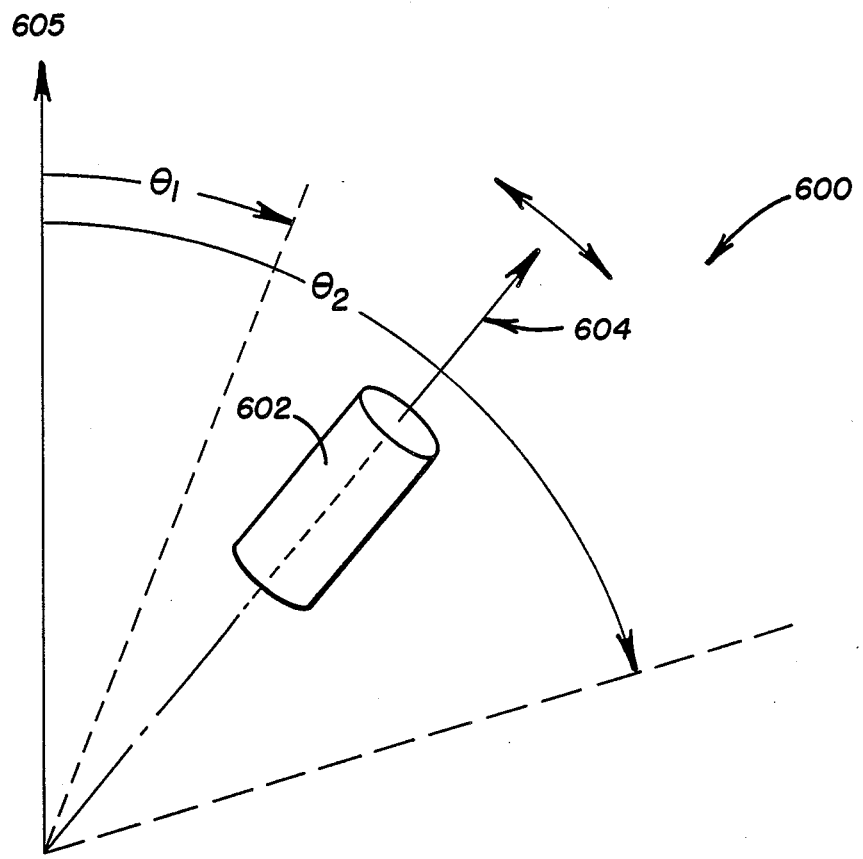
FIG. 7 is an alternative embodiment of the present invention.

An alternate embodiment of the present invention is illustrated in FIG. 7 at 600. The sample is placed in a sample holder 602 which spins about an axis 604. Axis 604 is hinged such that it pivots between angles $\Theta_1$ and $\Theta_2$ with respect to the direction 605 of the magnetic field during the time period in which the NMR spectrum is measured. This pivoting embodiment of the present invention differs from prior art NMR systems such as "variable angle spinning" or the prior art technique of two-dimensional correlation experiments in that the pivoting parameters are chosen so as to eliminate the contributions of two or more Legendre polynomials. In contrast, in variable angle spinning, the angle of the axis about which the specimen spins is fixed during the time the spectrum is measured.

The pivoting motion can be accomplished by moving axis 604 using a suitable mechanical mechanism 610. Such mechanisms are included in many NMR spectrometers where they are used to adjust the angle of spinning of the sample. The motion of the axis is such that said axis is confined to a plane. By choosing $\Theta_1$, $\Theta_2$, and the manner in which the axis pivots, the contributions of to the frequency dispersion resulting from two or more terms in Eq. (5) may be eliminated.

For example, suppose axis 604 pivots at a constant angular velocity between $\Theta_1$ and $\Theta_2$. Then if $\Theta_1$ and $\Theta_2$ are chosen such that $$\int_{\Theta_1}^{\Theta_2} P_n(\cos \Theta) \, d\Theta = 0 \quad (12)$$

for two values of n, then the contributions of the terms containing the Legendre polynomials in question will be eliminated. In the case in which $P_2$ and $P_4$ are to be eliminated, $\Theta_1 = 19.05$ degrees and $\Theta_2 = 99.19$ degrees. This condition is also satisfied by $\Theta_1 = 11.96$ degrees and $\Theta_2 = 132.4$ degrees.

In the more general case in which axis 604 moves at a non-constant angular velocity, the following condition must be satisfied to eliminate $P_n$:

$$\int P_n(\cos \Theta) W(\Theta) d\Theta = 0 \quad (13)$$

where $W(\Theta)$ is proportional to the time spent at each angle $\Theta$, and the integral is over the realized values of $\Theta$. A sinusoidal motion for axis 604 is particularly easy to implement. For example, $$\Theta(t) = \Theta_1 + (\Theta_2 - \Theta_1)\cos(\alpha t) \quad (14)$$

where $\alpha$ is a constant. In this case, it can be shown that the $P_2$ and $P_4$ terms can be eliminated if $\Theta_1 = 23.27$ degrees and $\Theta_2 = 117.37$ degrees.

If more than two terms in Eq. (5) are to be eliminated, one must introduce at least N free parameters into Eq. (13). This may be accomplished by utilizing motions which are more complex than the linear or sinusoidal motions described above. For example, axis 604 could be programmed to make discrete "flips" between N discrete angles, $\Theta_i$, where i runs from 1 to N. Here, axis 604 dwells at each location for a time which is long compared to the time needed to move between locations. In this case, $W(\Theta)$ would be the sum of a number of delta functions. That is, $W(\Theta)$ would be zero except when $\Theta$ was equal to $\Theta_i$, for some value of i between 1 and N. The values of the $\Theta_i$ would be determined such that the desired terms in Eq. (5) are eliminated. For example, in the case of discrete flips between two angles $\Theta_1$ and $\Theta_2$, the polynomials $P_2$ and $P_4$ can be eliminated with $\Theta_1 = 37.38$ degrees and $\Theta_2 = 79.19$ degrees.

The above flipping must be accomplished in a time which is short compared to the NMR time scale. If this is not possible, it will be apparent to those skilled in the NMR arts that prior art storage techniques may be utilized to increase the effective speed of the flipping motion.

Figure 8:
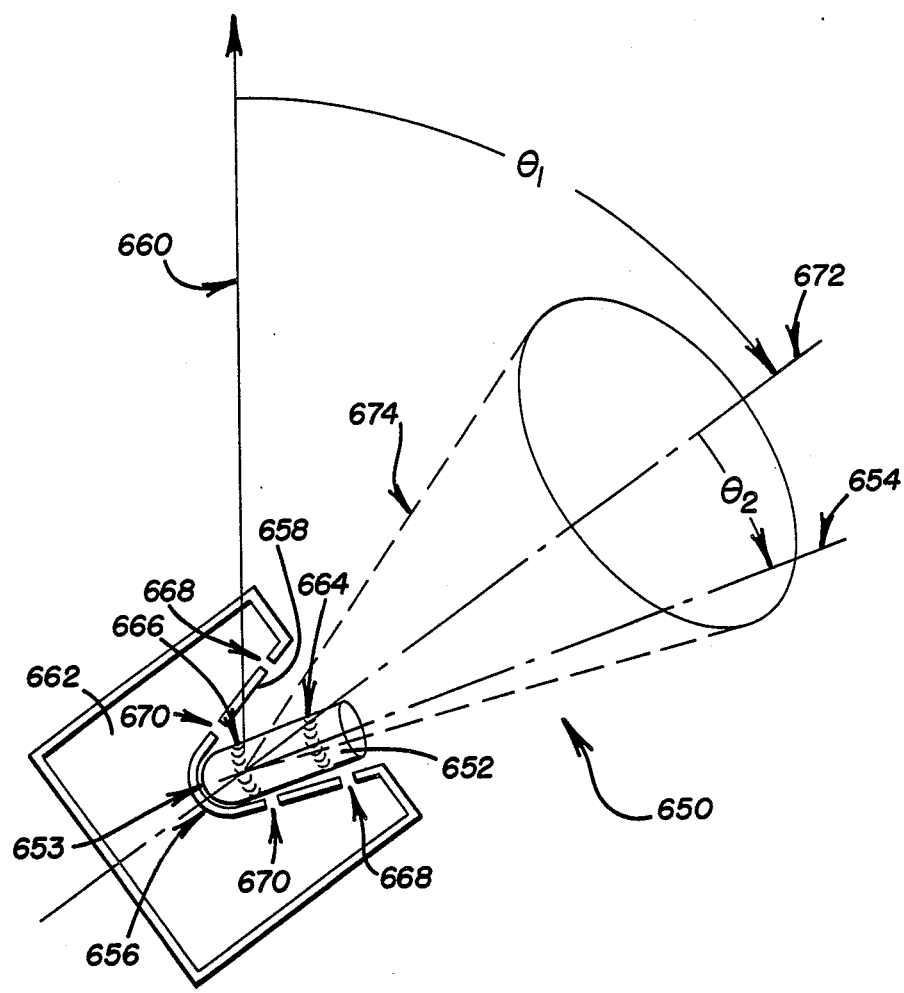
FIG. 8 is a third embodiment of the present invention.

A third embodiment of the present invention is illustrated in FIG. 8 at 650. The sample is placed in a sample holder 652 which spins about an axis 654. Sample holder 652 is a cylinder that has a rounded end as shown at 653. Sample holder 652 fits within the stationary stator 662 that is positioned between the poles of a magnet which creates an external magnetic field in direction 660. Stator 662 has a concave surface 656 that joins the inner frusto-conical surface 658 of stator 662 at one end. Rounded end 653 of sample holder 652 engages stator 662 at concave surface 656.

Axis 672 of stator 662 is inclined at angle $\Theta_1$ with respect to external magnetic field 660, and axis 654 is inclined at angle $\Theta_2$ from axis 672. Drive air from inlet ports 668 and 670 in stator 662 is made to impinge upon impellers 664 and 666 cut into the surface of sample holder 652. Air impinging upon sample holder 652 thus causes sample holder 652 to spin about axis 654 while simultaneously sweeping out the cone 674 around axis 672. Air impinging on sample holder 652 through inlet ports 670 also acts as an air bearing analogous to the air bearings described above.

Sample holder 652 is essentially a precessing gyroscope. The angular velocity at which axis 654 precesses about cone 674 is given by Eq. (9) discussed above.

By varying angles $\Theta_1$ and $\Theta_2$ of FIG. 8 for particular species, frequency dispersion contributions from two Legendre polynomials may be eliminated.

The embodiments of the present invention discussed above are specific examples of the more general embodiment of the present invention. As noted with reference to FIG. 1, the frequency dispersion contributed by the ith particle or region of the sample is given by $$D_i = \sum_{l=1}^{L} \sum_{m=-l}^{l} A_{lm}(\Omega_i) Y_{lm}(\Omega(t)) \quad (15)$$

Here, $Y_{lm}(\Omega(t))$ are the spherical harmonics of rank l, and $\Omega(t)$ is the set of angles specifying the orientation of the sample with respect to the magnet coordinate system. Here, it is assumed that only secular interactions up to rank L are significant. The $A_{lm}(\Omega_i)$ depend on inherent properties of the particles and on the orientation $\Omega_i$ of each particle in the sample. Since different particles have different angles, $\Omega_i$, the different particles resonate at different frequencies.

In the present invention the sample as a whole is reoriented in a time-dependent manner (i.e., $\Omega(t)$ is made time-dependent) such that the contributions of a finite number of the $Y_{lm}$ are eliminated. When the sample is reoriented relative to the magnetic field in a time frame which is sufficiently short, the measured NMR spectra, denoted $<w>$, is given by $$<w> = w_0 + \sum_{l=1}^{L} \sum_{m=-l}^{l} A_{lm} <Y_{lm}>, \qquad (16)$$

where $<Y_{lm}>$ denotes the average value of $Y_{lm}(\Omega(t))$ over the orientations through which the sample rotated during the time interval. The manner in which the sample reorients is chosen to be one for which all members of the set of $<Y_{lm}>$ are 0 for particular ranks l, thereby eliminating their contributions to the frequency dispersion. In the present invention, the sample is moved such that the average of at least two sets of spherical harmonics, $<Y_{lm}>$, are zero.

In magic angle spinning only $Y_{2m}$ terms are eliminated. When the sample is spun about an axis inclined at an angle $\Theta$ to the magnetic field, the relevant average term $<Y_{l0}>$ is proportional to $P_l(\cos \Theta)$. Hence, by choosing $\Theta$ such that $P_2(\cos \Theta) = 0$, i.e., the magic angle, the contributions of $P_2$ to the line broadening may be eliminated.

The above described embodiments of the present invention also utilize spinning about one or more axis.

Hence, the requirement that $<Y_{lm}> = 0$ was equivalent to requiring that the Legendre polynomial of the same order or some time average thereof be zero. However, from the above discussion, it will be apparent to those skilled in the NMR arts that sample motions other than spinning may be utilized. The key feature of such motions is that $<Y_{lm}> = 0$ for the most significant terms in Eq. (16). For measurements in which quadrupole interactions are the most important, the most significant terms are $<Y_{2m}>$ and $<Y_{4m}>$. However, for other measurements, other terms may be more important.

Although the above described embodiments of the present invention refer to the sample moving with respect to the magnet, it will be apparent to those skilled in the art that the sample could remain stationary. In this case, the magnetic field would be moved on a trajectory such that the average of two spherical harmonic functions is substantially zero.

Accordingly, there has been described herein a novel apparatus and method for performing NMR measurements. Various modifications to the present invention will become apparent to those skilled in the art from the foregoing description and accompanying drawings. Hence, the present invention is to be limited solely by the scope of the following claims.

What is claimed is:

1. An apparatus for measuring the NMR spectra of a sample, said apparatus comprising:
   means for holding said sample in a magnetic field, the orientation of said sample being specified by a set of angles, $\Omega$, said set of angles being measured with reference to the direction of said magnetic field; and
   orientation means for causing the orientation of said sample to change relative to said magnetic field, the orientation of said sample at time t being equal to $\Omega(t)$, wherein the time average of each of two different sets of spherical harmonic functions, $Y_{lm}$, is substantially zero over the values $\Omega(t)$ realized during the time of said NMR measurement.

2. The apparatus of claim 1 wherein said orientation means comprises:
   means for causing said sample holding means to spin about a sample axis;
   means for causing said sample axis to sweep out a cone having a predetermined opening angle, the axis of said cone being inclined at a predetermined angle to the direction of said magnetic field.

3. The apparatus of claim 2 wherein
   said sample holding means comprises a cylinder having an axial moment of inertia, $I_{ax}$, and a transverse moment of inertia, $I_{tr}$,
   said means for causing said sample holding means to spin comprises means for causing said cylinder to spin at an angular velocity of $w_1$ revolutions per second, and
   said means for causing said sample axis to sweep out a cone causes said axis to make one revolution on said cone every $1/w_{nut}$ seconds wherein
   $w_1$ is substantially equal to $(I_{tr} - I_{ax})w_{nut} \cos(i_2)/I_{ax}$, $i_2$ being the angle of inclination of the axis of said cone relative to said magnetic field direction.

4. The apparatus of claim 2 wherein the cosine of said opening angle is a zero of a first Legendre polynomial and the cosine of said angle of inclination is a zero of a second Legendre polynomial.

5. The apparatus of claim 4 wherein said first Legendre polynomial has order 2 and said second Legendre polynomial has order 4.

6. The apparatus of claim 2 wherein said sample holding means comprises a cylinder having a rounded end, said cylinder including impellers on the surface thereof, and wherein
   said means for causing said sample holding means to spin about a sample axis comprises:
   a frusto-conical stator having an axis inclined at said predetermined angle with respect to said magnetic field direction, and an opening angle equal to said predetermined opening angle, said stator further including means for engaging said rounded end; and means for directing air jets against said impellers.

7. The apparatus of claim 6 wherein said means for directing air jets comprises a plurality of inlet ports in said stator.

8. The apparatus of claim 2 wherein
   said sample holding means comprises a first cylinder having a compartment therein for holding said sample, the axis of said first cylinder being coincident with said sample axis, wherein
   said means for causing said sample holding means to spin comprises means for causing said first cylinder to spin about the axis thereof, and wherein
   said means for causing said sample axis to sweep out a cone comprises
   a second cylinder including means for holding said first cylinder such that the axis of said first cylinder is inclined at said opening angle with reference to the axis of said second cylinder, the axis of said second cylinder being inclined at said angle of inclination with reference to said magnetic field direction; and means for causing said second cylinder to spin about the axis thereof.

9. A method for measuring the NMR spectra of a sample, said method comprising the steps of:

placing said sample in a magnetic field, the orientation of said sample being specified by a set of angles $\Omega$, said set of angles being measured with reference to the direction of said sample magnetic field; and causing said sample to move relative to said magnetic field such that the orientation of said sample at time t is equal to $\Omega(t)$, wherein the time average of each of two sets of spherical harmonic functions, $Y_{lm}$, is substantially zero over the values $\Omega(t)$ realized during the time of said NMR measurement.

10. The method of claim 9 wherein said step of causing said sample to move comprises:

spinning said sample about a sample axis; and causing said sample axis to pivot about a fixed end thereof between first and second angles with respect to the direction of said magnetic field.

11. The method of claim 10 wherein said step of causing said sample axis to pivot further comprises causing said sample axis to move at a constant angular velocity between said first and second angles.

12. The method of claim 10 wherein said step of causing said sample axis to pivot further comprises:

causing said sample axis to dwell for a first time at said first angle;

causing said sample axis to move to said second angle; and causing said sample to dwell for a second time at said second angle.

13. The method of claim 10 wherein said step of causing said sample axis to pivot further comprises causing said sample axis to move between said first and second angles at an angular velocity which varies sinusoidally with time.

14. The method of claim 9 wherein causing said sample to move relative to said magnetic field comprises:

causing said sample to spin about a sample axis;

causing said sample axis to sweep out a cone having a predetermined opening angle, the axis of said cone being inclined at a predetermined angle to the direction of said magnetic field.

15. The method of claim 14 wherein the cosine of said opening angle is a zero of a first Legendre polynomial and the cosine of said angle of inclination is a zero of a second Legendre polynomial.

16. The method of claim 15 wherein said first Legendre polynomial has order 2 and said second Legendre polynomial has order 4.

* * * * *

UNITED STATES PATENT AND TRADEMARK OFFICE
CERTIFICATE OF CORRECTION

PATENT NO. : 4,899,111

DATED : February 6, 1990

INVENTOR(S) : Pines, et al.

It is certified that error appears in the above-identified patent and that said Letters Patent is hereby corrected as shown below:

Column 10, Line 65, delete "chose" and insert therefor --choose--.

Column 11, Line 40, delete "of" before --to--.

Signed and Sealed this

Twenty-ninth Day of September, 1992

Attest:

DOUGLAS B. COMER

Attesting Officer

Acting Commissioner of Patents and Trademarks